United States Patent [19]
Hoshika

[11] Patent Number: 4,518,859
[45] Date of Patent: May 21, 1985

[54] ANGLE MEASURING DEVICE WITH LINE SENSOR

[75] Inventor: Shuji Hoshika, Tokyo, Japan

[73] Assignee: Asahi Kogaku Kogyo Kabushiki Kaisha, Tokyo, Japan

[21] Appl. No.: 331,345

[22] Filed: Dec. 16, 1981

[30] Foreign Application Priority Data

Dec. 20, 1980 [JP] Japan ................ 55-181025

[51] Int. Cl.$^3$ ............................................. G01D 5/34
[52] U.S. Cl. ..................... 250/231 SE; 250/237 G
[58] Field of Search .................. 250/231 SE, 237 G; 356/395; 340/347 P

[56] References Cited

U.S. PATENT DOCUMENTS

| | | | |
|---|---|---|---|
| 3,153,111 | 10/1964 | Barber et al. ............ | 250/237 G X |
| 3,549,897 | 12/1970 | Blake ................... | 250/231 SE |
| 3,748,043 | 7/1973 | Zipin .................... | 250/237 G |
| 3,819,909 | 6/1974 | Thompson ............... | 250/561 X |
| 4,100,420 | 7/1978 | Metcalf et al. .......... | 250/231 SE |
| 4,224,514 | 9/1980 | Weber ................... | 250/231 SE |
| 4,253,021 | 2/1981 | Ernst ................... | 250/231 SE |

*Primary Examiner*—David C. Nelms
*Attorney, Agent, or Firm*—Sughrue, Mion, Zinn, Macpeak & Seas

[57] ABSTRACT

A scale board carries a scale having a predetermined pitch and a light source projects this scale onto an array of sensors having a pitch which is substantially but not exactly equal to the pitch of the scale. By comparing successive pairs of sensor outputs, the angular position of the scale board can be determined to a resolution much smaller than the scale pitch.

13 Claims, 12 Drawing Figures

ANGLE MEASURING DEVICE WITH LINE SENSOR

BACKGROUND OF THE INVENTION

This invention relates to an angle measuring device such as a theodolite.

Heretofore, in order to measure a very small angle with a theodolite or the like, an electrical signal related to an amount of rotation of the scale board in the theodolite has been phase compared with a reference signal, or the very small angle has been determined from the amplitude of an electrical signal related to an amount of rotation of the scale board.

For instance, Japanese Patent Application Laid-Open No. 64056/1978 describes an improvement on the former method. More specifically, the electrical signal A sin ($\omega t + \phi_1$) related to the amount of rotation of the scale board is detected, and the very small angle is obtained from the phase difference $\phi_1$ between that electrical signal and the reference signal sin $\omega t$. In order to practice this method, an accurate sinusoidal track is provided on the circumference of the scale board, and four rectangular optical detecting diodes are employed which are arranged at 90° phase intervals in the period of the sinusoidal track. In addition, in order to detect a very small angle, 4096 radial slit tracks and optical detecting diodes (which are also arranged at 90° phase intervals) are employed with the diodes having masks in the form of a sine wave with a period of 13. Accordingly, in the device disclosed by Japanese Patent Application Laid-Open No. 53-64056, the tracks on the scale board and the masks are intricate and must be manufactured with high accuracy, and the phase relations between these elements must be adjusted strictly.

In one example of the latter method, moiré stripes or interference stripes are formed by a scale on the scale board and a stationary scale, and a very small angle is obtained from the amplitude of an electrical sine wave corresponding to these stripes. This method is simple in arrangement, but since the amplitude of the output depends to a large extent not only on the amount of rotation of the scale board but also on the variation of intensity of the light source, the value of an angle can only be measured with low accuracy, and it is therefore necessary to correct the value with respect to the variation of intensity of the illuminating light.

SUMMARY OF THE INVENTION

This invention is intended to eliminate the above-described drawbacks. More specifically, a first object of this invention is to provide an angle measuring device having a high measurement accuracy in which the components are simple and the adjustment can be achieved readily.

A second object of this invention is to provide an angle measuring device in which the measurement is not affected by the variation in intensity of a light source adapted to illuminate the scale board.

In an angle measuring device according to this invention, a scale formed at equiangular intervals on a scale board is projected onto a line sensor in such a manner that the pitch of the scale is substantially equal (but not exactly equal) to the pitch of the line sensor, and a very small angle is obtained from the output of the line sensor under this condition. Therefore, the device is much simpler in arrangement and adjustment. In a device with such a construction, the measurement is not affected by the variation in intensity of light illuminating the scale board, detection signals are processed in a digital mode so that the device can be readily coupled to a microprocessor, and the device is high in reliability.

BRIEF DESCRIPTION OF THE DRAWINGS

The invention will be described with reference to its preferred embodiments shown in the accompanying drawings, in which:

FIG. 2(*b*) is a graphical representation indicating the outputs of the line sensor under the conditions shown in FIG. 2(*a*);

FIGS. 3(*b*) and 3(*c*) are time charts indicating signals which are obtained by alternately sampling and holding the outputs of light receiving sections in the line sensor;

FIG. 3(*d*) is a time chart showing an output which is provided by applying the signals shown in FIGS. 3(*b*) and 3(*c*) to a comparator circuit;

FIG. 3(*e*) is a time chart showing the output of a pulse generating circuit which produces a pulse when the output shown in FIG. 3(*d*) changes from the high level to the low level;

DETAILED DESCRIPTION OF THE INVENTION

Figure 1:
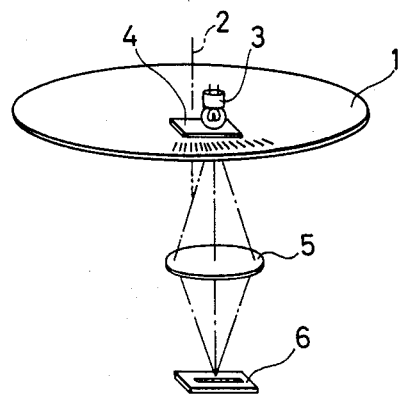
FIG. 1 is an explanatory diagram showing the fundamental arrangement of an angle measuring device according to this invention.

FIG. 1 shows the most fundamental arrangement of an angle measuring device according to this invention. In FIG. 1, reference numeral 1 designates a scale board incorporated in an angle measuring device such as a theodolite. An equiangular pitch scale consisting of transparent portions and opaque portions which are arranged at equiangular intervals are marked on the scale board 1. In a theodolite or the like, a collimating telescope is turned around a rotary shaft 2 together with the scale board 1, and measurement of the angle between two aimed points through collimation with the telescope is achieved by measuring the angle of rotation of the scale board 1. To this end, light from a light source 3 is applied through a diffusing plate 4 to the scale board 1, so that the image of the graduations on the scale board 1 is projected onto a line sensor 6 through a projection lens 5. In this case, the projection lens 5 is so positioned that the width of each graduation on the scale board 1 is substantially equal to the width of a light receiving section in the line sensor.

Figure 2A:
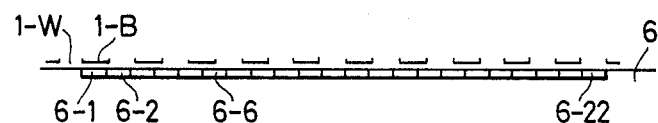
FIG. 2(*a*) is a diagram showing the positional relationships between a line sensor and a scale projected onto the line sensor.
Figure 2B:
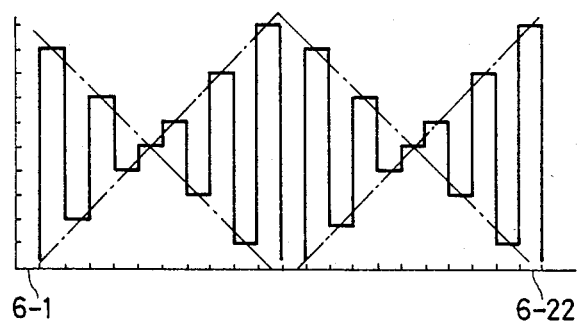

FIG. 2(a) is a diagram showing the positional relationships between the line sensor 6 and the image of the graduations (consisting of the transparent portions 1-W and the opaque portions 1-B which are arranged at equiangular intervals) projected onto the line sensor 6. FIG. 2(b) is a diagram showing the corresponding output of the line sensor. In this connection, it is assumed that, for instance, the line sensor 6 has twenty-two light receiving sections 6-1, 6-2, . . . and 6-22 each of which has a light receiving surface in the form of a square 25 $\mu m \times 25$ $\mu m$, and the image of the scale is so projected onto the line sensor 6 that each of the transparent and opaque portions is 27.5 $\mu m$ and each of the opaque portions is 27.5 $\mu m$. Furthermore, it is assumed that the circumference of the scale board is divided into 4,320 equal segments (each being the combination of one transparent portion and one opaque portion). If, under these conditions, the projection magnification is one (1), the scale board must have a diameter of about 27.5 $\mu m \times 4320 \times 2/\pi = 75.630$ mm. Such a scale board size is suitable for a theodolite or the like. When the graduations on this scale board are projected onto the line sensor (which is linear, having a width of 25 $\mu m$ and a length of 25 $\mu m \times 22$), then the image of the graduations is formed arcuately on the line sensor. However, in this case, the graduations projected are of a very small range corresponding to ten segments ($50' = 360° \times 10/4320$ in terms of angles). Therefore, even if the equidistant graduations are considered to be linearly projected, the error is very small. Furthermore, no intricate adjustment is required at the projection.

The fundamental arrangement of the angle measuring device of the invention has been described with various specific data, e.g., 25 $\mu m \times 25$ $\mu m$ for each light receiving area of the line sensor, 22 for the number of light receiving surfaces, and 4320 for the number of division parts of the scale board; however, the device of the invention is not limited thereto or thereby. That is, it can be readily understood from the performance of the projection lens that, with other data as well, the width of each graduation on the scale board can be made substantially but not exactly equal to the width of each light receiving element on the line sensor.

FIG. 2(b) shows the outputs of the line sensor 6 when the image of the graduations on the scale board is formed on the line sensor as shown in FIG. 2(a). In FIG. 2(b), the vertical axis represents the output amplitudes and the horizontal axis represents the light receiving element positions or time. The transparent portions 1-W and the opaque portions 1-B are arranged at an equal pitch on the scale board, the light receiving sections are arranged also at an equal pitch on the line sensor 6, and the positional relation between the scale board and the line sensor is shifted linearly, as was described above. Therefore, it can be readily understood from these facts that the output of the line sensor 6 will vary as shown in FIG. 2(b). The line sensor 6 has a very short electrical scanning period, and therefore it can also be understood that, even if the luminance of the light source changes with time, the relationships between these outputs will be maintained unchanged.

Under these output conditions, let us consider one of the light receiving sections having a certain output level. It is assumed that the certain output level is half of the sum of the maximum output level and the minimum output level, e.g. the output level of the light receiving section 6—6. If the scale board is turned slightly to the right for instance, then this certain output level will be outputted by a different light receiving section. When the scale board is turned through an angle corresponding to one division part, the certain output level is again provided by the light receiving section 6—6. Therefore, by detecting the light receiving section which provides a predetermined output level, the angle measurement can be made to an accuracy of an angle much smaller than the angle corresponding to one division part on the scale board. The smaller angle is about 14" with the aforementioned numerical data. ($360°/4320 = 5' = 300"$ is divided by 22, and the result is about 14".)

Figure 3A:
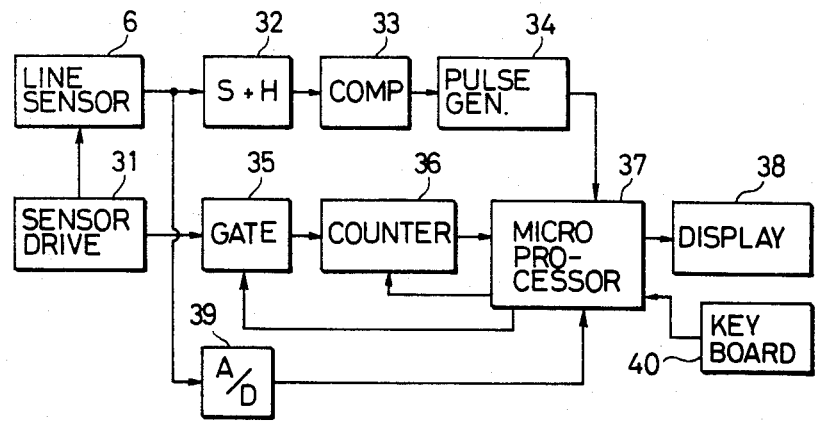
FIG. 3(*a*) is a block diagram showing one example of a processing circuit for detecting an angle of rotation of a scale board.
Figure 3B:
Figure 3C:
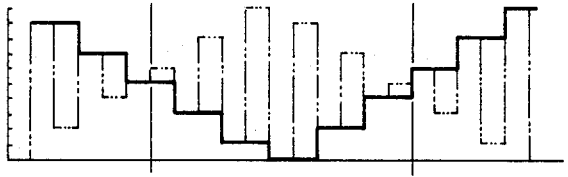
Figure 3D:
Figure 3E:
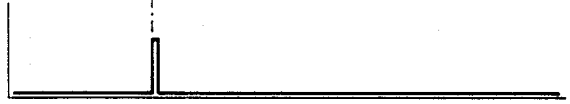

FIG. 3(a) shows one example of a processing circuit for detecting an angle of rotation of the scale board. The line sensor 6 is driven by a line sensor drive circuit 31, and provides outputs as shown in FIG. 2(b) when the image of graduations is formed as shown in FIG. 2(a) as was described before. The outputs thus provided are converted into two samples and hold outputs by a sample and hold circuit 32 which samples and holds every other output. The two sample and hold outputs are as shown in FIG. 3(b) and FIG. 3(c), respectively, in which the dotted line indicates the original outputs of the line sensor 6. By applying these two sample and hold outputs to a comparator circuit 33, a logic signal as shown in FIG. 3(d) can be obtained. Since the relationships between the outputs of the line sensor 6 are independent of the variation of luminance with time of the light source as described before, the logic signal is also independent of the variation of luminance. In the logic signal, the position, e.g. where the high level output is changed to the low level output corresponds to the angle of rotation of the scale board which is the aforementioned smaller angle (hereinafter referred to as "an extremely small angle"). The output of the comparator 33 is applied to a pulse generating circuit 34, so that the latter 34 produces a pulse output (hereinafter referred to as "an intersection output") as shown in FIG. 3(e) at the position where the high level output is changed to the low level output as described before.

A gate circuit 35 operates to control the application of a line sensor drive clock pulse outputted by the line sensor drive circuit 31 to a clock pulse counter 36. The line sensor drive clock pulse is used to operate each light receiving section in the line sensor 6. The light receiving sections can be located by counting the number of clock pulses. In other words, upon detection of the fact that the line sensor drive circuit 31 has driven the first light receiving section, a micro-processor 37 opens the gate circuit 35 to input the line sensor drive clock pulses to the clock pulse counter 36. When the micro-processor 37 detects the intersection output with the aid of the sample and hold circuit 32 which samples and holds the output of every other light receiving section, the comparator circuit 33 and the pulse generating circuit 34, the microprocessor 37 closes the gate circuit 35, and resets the clock pulse counter 33 after reading the content of the clock pulse counter 36. The number of clock pulses read out of the clock pulse counter 36 corresponds to the position of the light receiving section which has provided the intersection output. Therefore, the microprocessor 37 can detect the exact present position of the scale board by storing the number of clock pulses thus read.

A initial angle setting is carried out by inputting a required angle into the microprocessor 37 with a keyboard 40. The keyboard 40 is used to input various instructions (such as a degree-to-graduation conversion instruction and a graduation-to-degree conversion instruction) into the microprocessor 37.

As the scale board is turned, the light receiving section providing the intersection output is replaced by a different one, and the number of clock pulses which can be applied to the clock pulse counter 36 before the intersection output is detected is also changed. The microprocessor 37 reads the content of the clock pulse counter 36 at all times, and the microprocessor 37 is so programmed that it recognizes that the scale board is turned clockwise when the number of clock pulses stored in the counter is increased and the scale board is turned counterclockwise when the number of clock pulses is decreased, for instance. The microprocessor stores how many times the intersection output has passed through a particular light receiving section at a predetermined position (or how many times the particular light receiving section has produced the intersection output) and the direction of movement of the intersection output, so that an angle larger than the maximum value (5' with the aforementioned data) of the extremely small angle which can be detected by the line sensor is measured with the maximum value as a minimum unit. That is, a coarse angle measurement is carried out by counting the number of complete divisions of rotation as indicated by the intersection output from a particular sensor. When the scale board is stopped, the extremely small angle is again calculated from the position of the intersection output, and the total angle of rotation is calculated by adding together the coarse and fine angle measurements. The calculation result is displayed on a display section 38.

In the above-described embodiment of the invention, an extremely small angle smaller than the angle corresponding to one segment of the scale board is detected from the light receiving section producing the intersection output in the line sensor; and an angle larger than the angle corresponding to one segment of the scale is detected by storing how many times the intersection output has passed through a particular light receiving section at a predetermined position and in the direction of movement. However, an angle larger than the angle corresponding to one segment of the scale (or an angle larger than 5' which is the minimum angle unit in the above-described embodiment) can be measured with other well-known means. One example of this means will be described.

Figure 4:
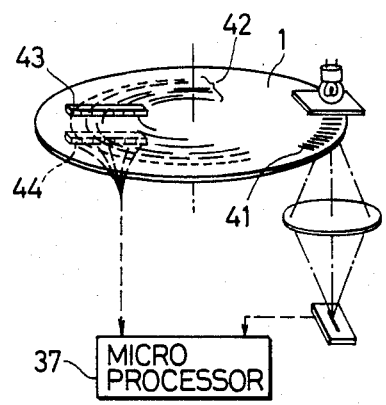
FIG. 4 is an explanatory diagram showing the device of the invention which is combined with an absolute encoder.

Let us consider the case where a scale board is used whose circumference is divided into 4,320 equal parts similarly as in the above-described embodiment. In this case, an angle corresponding to one segment is five minutes (5'). In order to obtain the absolute values of angles with 5' as a minimum angle unit, a scale board should be designed as a 13-bit ($2^{13}=8192$) absolute encoder. One example of an angle measuring device having such a scale board is as shown in FIG. 4. Graduations 41 are marked at equiangular intervals on the periphery of the scale board 1, in order to detect an angle smaller than the angle corresponding to one segment of the scale. The scale board 1 has an absolute encode pattern 42 which is well known in conventional absolute encoders. The pattern is employed to obtain the absolute values of angles larger than the angle corresponding to one segment. The number of bits is determined by the amount necessary for reading angles with the angle corresponding to one segment of the equiangular pitch scale 41 as an angle unit, this number of bits being thirteen (13) with the numerical data aforementioned in the above-described embodiment.

The absolute encode pattern 42 is illuminated by a light source 43 and is converted, for instance, into gray codes by a photo-detector element array 44, as a result of which angular data are inputted into a microprocessor 37 with the angle corresponding to one division part as an angle unit. Angular data representative of an angle smaller than the angle corresponding to one segment are inputted into the microprocessor 37 by the above-described means. Both of the angular data are processed by the microprocessor 37, so that the absolute value of the angle of rotation of the scale board is calculated and displayed.

Figure 5:
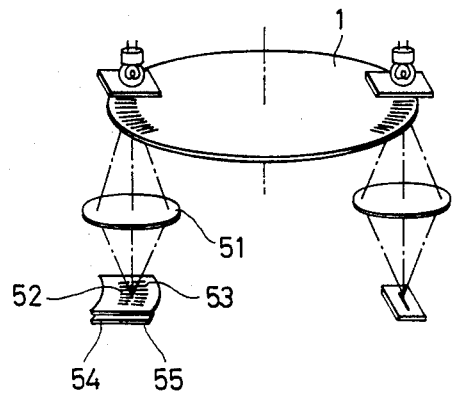
FIG. 5 is an explanatory diagram showing the device of the invention which is combined with means for providing two-phase pulse outputs different by 90° in phase from each other.

A second example of a method of obtaining an angle larger than the angle corresponding to one segment is a method in which an angle signal corresponding to one division part of the scale board and a rotation direction recognizing signal are obtained from two-phase pulse outputs which differ in phase by 90° such pulses being well known in the field of incremental encoders or the like. FIG. 5 shows one example of a device for practicing this method. The graduations on a scale board 1 are projected onto masks 52 and 53 through a lens 51. The phases of the masks 52 and 53 are shifted by 90° (corresponding to a quarter (¼) segment) from each other, and therefore light receiving elements 54 and 55 behind the masks 52 and 53 provide two-phase outputs the phases of which are different by 90° from each other. By subjecting these outputs to waveform shaping, the angle signal corresponding to one segment of the scale, together with a rotation direction recognizing a signal, are inputted into the microprocessor in a conventional manner. On the other hand, an angle signal representative of an angle smaller than the angle corresponding to one segment is inputted into the microprocessor with the aid of the arrangement shown in FIG. 1 and by the means shown in FIG. 3. The microprocessor calculates the angle of rotation of the scale board from these input angle signals, and displays it.

Figure 6:
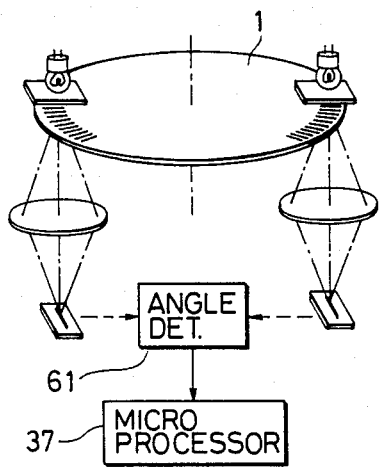
FIG. 6 is an explanatory diagram showing the devices of the invention which are so arranged to practice a diametrically opposed reading method.

Most theodolites employ a diametrically opposed reading method in order to correct an angle read error caused by noncoincidence of the center of the scale board with the center of rotation of the scale board. FIG. 6 shows one example of the extremely small angle detecting section of the detection according to this invention, which is so designed as to conduct this diametrically opposed reading method. Two devices shown in FIG. 1 are disposed diametrically opposite each other on both sides of the scale board 1. The outputs of the line sensors are applied to a microprocessor 37 through an extremely small angle detecting circuit 61 which operates on the same principle as that of the circuit in FIG. 3. For example, the circuit 61 may be substantially the same as FIG. 3 but include a second set of the components 32-36 for processing a second set of signals from the second line sensor. Thus, the microprocessor 37 is so programmed that it receives the angles of rotation of the scale board at the diametrically opposed positions, and averages these angles of rotation, to correct the angle read error atrributed to the error of eccentricity. This method of FIG. 6 may be employed in combination with each of the above-described methods of FIGS. 4 and 5 for detecting an angle larger than the angle corresponding to one segment.

Figure 7:
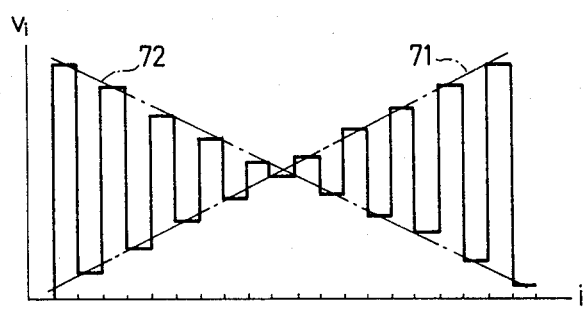
FIG. 7 is a diagram for obtaining regression straight lines from the outputs of the line sensor.

In this invention, the extremely small angle is detected by detecting the position of the light receiving section at which the intersection output occurs during scanning of the line sensor, with the light receiving position being determined by comparison of the outputs of the sample and hold circuits adapted to sample and hold the output of every other light receiving section, as described above with reference to FIGS. 3(b) through 3(e). Therefore, if the outputs of the light receiving sections are subjected, as data, to regression analysis so that the intersection position is obtained statistically, than the extremely small angle measurement accuracy can be improved. For this purpose, it may be preferable to add an A-D (analog-to-digital) converter 39 to the circuitry which has been described with reference to FIG. 3. In FIG. 3, from the inputs from the line sensor drive circuit 31 and the A-D converter 39, the microprocessor 37 obtains data indicating that the i-th output of the line sensor 6 is $v_i$. FIG. 7 shows one example of such input data. In FIG. 7, the horizontal axis represents a light receiving section number i and the vertical axis represents an output $v_i$ thereof. In order to obtain regression straight lines 71 and 72, under the condition that the outputs of odd-number light receiving sections and outputs of even-number light receiving sections form straight lines, the following calculations are carried out by the microprocessor:

Regression straight line by odd-number data $$v = a_O + b_O(i - \bar{i}_O)$$

$\bar{i}_O$: the averages of the odd-number light receiving sections' numbers $a_O = \bar{v}_O$: the average of the odd-number light receiving sections' outputs $$b_O = \{\epsilon(i-\bar{i}_O)v_i\}/\epsilon(i-\bar{i}_O)^2$$

(where i is an odd number)
Regression straight line by even number data $$v = a_e + b_e(i - \bar{i}_e)$$

$\bar{i}_e$: the average of the odd-number light receiving sections' numbers $a_e = \bar{v}_e$: the average of the even-number light receiving sections' outputs $$b_e = \{\epsilon(i-\bar{i}_e)v_i\}/\epsilon(i-\bar{i}_e)^2$$

(where i is an even number)
The value of i at the intersection of these two regression straight lines is:

$$i = \{(b_O\bar{i}_O - b_e\bar{i}_e) - (a_O - a_e)\}/(b_O - b_e).$$

From this value of i, the intersection of the outputs of the sample and hold circuit adapted to sample and hold the output of every other light receiving section is obtained through statistical process, and therefore the extremely small angle can be detected with higher accuracy. The statistical regression analysis can be used to supplement or replace the detection based on the output of pulse generator 34. In the regression analysis, the data may, if desired, be allowed to regress to curves other than a straight line.

In general, it is desired to measure not only horizontal angles but also vertical angles with an angle measuring device such as a theodolite. The angle measuring device of this invention shown in FIG. 1 is applicable to both of the horizontal and vertical angle measurements.

As is apparent from the above description, the device of this invention is simple in construction, and the adjustment between the components can be readily achieved. With this device, angles can be measured with high accuracy independently of the variation of luminance of the light source. Thus, the angle measuring device of the invention is effective in many practical applications.

What is claimed is:

1. An angle measuring device comprising:
   a scale board having a scale which consists of substantially equiangular transparent portions and opaque portions which are alternately arranged at equiangular intervals in the form of a circle;
   light source means for illuminating said scale on said scale board;
   line sensor means having a plurality of substantially contiguous light receiving sections.
   projection lens means for projecting an image of said scale of said scale board in such a manner that the pitch of an image of a combined transparent and opaque portion is greater than twice the pitch of said light receiving sections in said line sensor means;
   a processing circuit for detecting an angle of rotation of said scale board from the values of multiple finite outputs of said line sensor with a resolution substantially greater than said equiangular interval; and
   a display section for displaying an output of said processing circuit.

2. A device as claimed in claim 1, wherein said line sensor means includes first and second line sensors each having a plurality of substantially contiguous light receiving sections and said projection lens means includes a first projection lens for projecting an image of a first portion of said scale board onto said first line sensor and a second projection lens for simultaneously projecting an image of a second portion of said scale board on said second line sensor and wherein said processing circuit averages the angles of rotation derived from each of said line sensors to reduce errors.

3. A device as claimed in claim 2, wherein said light source means includes first and second light sources for illuminating said first and second portions, respectively.

4. A device as claimed in claim 2, wherein said first and second portions of said scale are substantially diametrically opposite portions of said scale board.

5. A device as claimed in claim 1, further comprising coarse detection means for detecting the rotational angle of said scale board with a resolution greater than or equal to said equiangular interval.

6. A device as claimed in claim 5, wherein said coarse detection means comprises a coded pattern formed on said scale board at predetermined angular intervals greater than or equal to said equiangular interval, and means for detecting said coded pattern.

7. A device as claimed in claim 5, wherein said coarse detection means comprises:
   two masks having scales whose phases are shifted with respect to each other by an angle corresponding to a quarter (¼) segment of said scale on said scale board and whose scales are equal in angular pitch to said scale on said scale board;
   coarse light receiving elements behind each of said two masks, said coarse light receiving elements providing respective output signals having phases which differ in phase by an angle corresponding to one quarter of one segment of said scale; and a signal amplifier circuit for amplifying and comparing outputs of each of said coarse light receiving elements, to thereby detect an angle of rotation of said scale board equal to or larger than said equiangular interval.

8. A device as claimed in any one of claims 1, 2 or 5, wherein said line sensor means light receiving sections are designated by consecutive integers i according to their physical locations, and each produces an output signal $v_i$, said processing circuit detecting a minimum difference between consecutive output signals $v_i$ and $v_{i+1}$.

9. A device as claimed in claim 8, wherein said processing circuit comprises:
  means for scanning said line sensor means light receiving sections to produce a series of output signals $v_i$;
  sample-and-hold means for holding the signals $v_i$ where i is an odd integer to generate a first comparison signal and for holding the signals $v_i$ where i is an even integer to generate a second comparison signal; and
  comparison means for comparing said first and second comparison signals and generating a detection signal in response to a change in the polarity of the difference therebetween.

10. A device as claimed in claim 9, wherein said means for scanning generates a scanning pulse train and wherein said processing circuit further comprises counting means for counting the pulses in said scanning pulse train during said scanning until said detection signal is generated, the count value in said counting means at the time of said detection signal representing resolution substantially greater than said equiangular interval.

11. A device as claimed in claim 1, in which said processing circuit for calculating an angle of rotation of said scale board includes a microprocessor.

12. A device as claimed in claim 11, which further comprises an analog-to-digital converter for subjecting an output of said line sensor to analog-to-digital conversion, said microprocessor statistically analyzing the output of said analog-to-digital converter to determine said angle of rotation.

13. A device as claimed in claim 1, wherein said processing circuit includes means for calculating the intersection of two regression straight lines determined from the outputs of two separate sets of light receiving sections and the locations of the light receiving sections in said line sensor mean, each said set comprising every other said light receiving section, said intersection being associated with said angle of rotation.

* * * * *